United States Patent
He et al.

(10) Patent No.: US 12,439,811 B2
(45) Date of Patent: Oct. 7, 2025

(54) DISPLAY PANEL AND DISPLAY DEVICE

(71) Applicants: Chengdu BOE Optoelectronics Technology Co., Ltd., Sichuan (CN); BOE TECHNOLOGY GROUP CO., LTD., Beijing (CN)

(72) Inventors: Fan He, Beijing (CN); Kemeng Tong, Beijing (CN); Xiangdan Dong, Beijing (CN)

(73) Assignees: Chengdu BOE Optoelectronics Technology Co., Ltd., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 89 days.

(21) Appl. No.: 17/908,361

(22) PCT Filed: Oct. 26, 2021

(86) PCT No.: PCT/CN2021/126312
§ 371 (c)(1),
(2) Date: Aug. 31, 2022

(87) PCT Pub. No.: WO2022/213582
PCT Pub. Date: Oct. 13, 2022

(65) Prior Publication Data
US 2024/0196721 A1    Jun. 13, 2024

(30) Foreign Application Priority Data
Apr. 6, 2021 (CN) .......................... 202110367843.5

(51) Int. Cl.
*H10K 77/10* (2023.01)
*H10K 59/40* (2023.01)
*H10K 102/00* (2023.01)

(52) U.S. Cl.
CPC .......... *H10K 77/111* (2023.02); *H10K 59/40* (2023.02); *H10K 2102/311* (2023.02); *H10K 2102/351* (2023.02)

(58) Field of Classification Search
CPC ................. H10K 77/111; H10K 59/40; H10K 2102/311; H10K 2102/351; H10K 59/12;
(Continued)

(56) References Cited

U.S. PATENT DOCUMENTS 11,243,630 B2 * 2/2022 Gwon ................. G06F 3/04166

FOREIGN PATENT DOCUMENTS

| CN | 106449712 A | | 2/2017 | |
| CN | 109378335 A | * | 2/2019 | ............... F27B 7/24 |

(Continued)

OTHER PUBLICATIONS

Machine translation of CN-109378335 (Year: 2021).*
China Patent Office, First Office Action, Mar. 25, 2022, Application No. CN202110367843.5.

*Primary Examiner* — J. E. Schoenholtz
(74) *Attorney, Agent, or Firm* — HOUTTEMAN LAW, LLC

(57) ABSTRACT

Provided is a display panel, including a display substrate including a display region and a bonding region; and a touch layer on the display substrate. The bonding region includes a bending region and a first non-bending region adjacent to each other. The display substrate further includes a first conductive layer at least located in the bending region. The touch layer is in the first non-bending region; the touch layer has a first boundary in an adjacent area between the bending region and the first non-bending region, and includes sequentially disposed a first electrode layer, an insulating layer and a second electrode layer. Edges of the second electrode layer and the first conductive layer overlap, orthographic projections of first boundaries of the second elec-
(Continued)

trode layer, the first electrode layer and the insulating layer on the display substrate do not overlap, and are sequentially located away from the bending region.

19 Claims, 7 Drawing Sheets

(58) Field of Classification Search
CPC ... H10K 59/131; Y02E 10/549; G06F 3/0412; G06F 3/0445
See application file for complete search history.

(56) References Cited

FOREIGN PATENT DOCUMENTS

| | | |
|---|---|---|
| CN | 109801949 A | 5/2019 |
| CN | 110265459 A | 9/2019 |
| CN | 111128010 A | 5/2020 |
| CN | 111796721 A | 10/2020 |
| CN | 111969126 A | 11/2020 |
| CN | 112467061 A | 3/2021 |
| CN | 113053990 A | 6/2021 |
| JP | 2001343908 A | 12/2001 |

* cited by examiner

DISPLAY PANEL AND DISPLAY DEVICE

TECHNICAL FIELD

Embodiments of the present disclosure relate to the field of display technology, and particularly relate to a display panel and a display device.

BACKGROUND

With the rapid development of the Active-matrix organic light-emitting diode (AMOLED) display technology, AMOLED display screens enter an era of full screen and narrow bezel. For giving better use experience to users, full screen, narrow bezel, high resolution, being wearable in a roll-up way, and being foldable will certainly become important development directions of AMOLED display products in the future.

In order to produce a lighter and thinner AMOLED display screen with a higher integration level, the Flexible Multi-Layer On Cell (FMLOC) technology is developed. The FMLOC technology is to manufacture, after an EVEN process (an evaporation process) of all film layers of a light-emitting element and a packaging process of the light-emitting element are completed, a metal mesh electrode layer on a packaged structure to form driving electrode (Tx) and sensing electrode (Rx) channels of the FMLOC technology, thus realizing a touch function of the display screen. The FMLOC technology obviates the need for an externally attached touch panel, so that a thickness of the screen can be reduced, thereby facilitating folding; meanwhile, a bezel width can be reduced because there is no fitting tolerance.

SUMMARY

The embodiments of the present disclosure provide a display panel and a display device.

In a first aspect, an embodiment of the present disclosure provides a display panel, including:
a display substrate; and
a touch layer disposed on at least one side of the display substrate, where
the display substrate includes a display region and a bonding region located on at least one side of the display region, and the bonding region including a bending region and a first non-bending region, which are adjacent to each other;
the display substrate further includes a first conductive layer at least located in the bending region;
the touch layer is located in the first non-bending region; and a first boundary of the touch layer is located in an adjacent area between the bending region and the first non-bending region;
the touch layer includes a first electrode layer, an insulating layer and a second electrode layer, which are sequentially disposed away from the first conductive layer; and an edge of the second electrode layer overlaps an edge of the first conductive layer, and where
orthographic projections of first boundaries of the second electrode layer, the first electrode layer and the insulating layer on the display substrate do not overlap one another, and are sequentially located away from the bending region.

In some implementations, the bonding region further includes a second non-bending region located on a side of the bending region away from the first non-bending region, and the second non-bending region is adjacent to the bending region;

the touch layer is also located in the second non-bending region; and a second boundary of the touch layer is located in an adjacent area between the bending region and the second non-bending region; and orthographic projections of second boundaries of the second electrode layer, the first electrode layer and the insulating layer on the display substrate do not overlap one another, and are sequentially located away from the bending region.

In some implementations, the first conductive layer further extends into the first non-bending region; and
the orthographic projections of the first boundaries of the second electrode layer, the first electrode layer and the insulating layer on the display substrate fall on the first conductive layer.

In some implementations, the first conductive layer further extends into the second non-bending region; and
the orthographic projections of the second boundaries of the second electrode layer, the first electrode layer and the insulating layer on the display substrate fall on the first conductive layer.

In some implementations, the orthographic projection of the first boundary of the second electrode layer on the display substrate overlaps a bordering boundary between the bending region and the first non-bending region; and
the orthographic projection of the second boundary of the second electrode layer on the display substrate overlaps a bordering boundary between the bending region and the second non-bending region.

In some implementations, the orthographic projection of the first boundary of the first electrode layer on the display substrate is separated from the orthographic projection of the first boundary of the second electrode layer on the display substrate by a first distance;
the orthographic projection of the first boundary of the first electrode layer on the display substrate is separated from the orthographic projection of the first boundary of the insulating layer on the display substrate by a second distance;
the orthographic projection of the second boundary of the first electrode layer on the display substrate is separated from the orthographic projection of the second boundary of the second electrode layer on the display substrate by the first distance;
the orthographic projection of the second boundary of the first electrode layer on the display substrate is separated from the orthographic projection of the second boundary of the insulating layer on the display substrate by the second distance; and
the first distance is smaller than or equal to the second distance.

In some implementations, the first distance is in a range of 4 μm-8 μm; and the second distance is in a range from 5 μm to 10 μm.

In some implementations, a thickness of the insulating layer is in a range from 2800 Å to 3200 Å; and
a thickness of the first electrode layer is in a range from 1800 Å to 2200 Å.

In some implementations, a slope angle of the first boundary of the insulating layer is in a range from 80° to 90°; and a slope angle of the second boundary of the insulating layer is in a range from 80° to 90°; and a slope angle of the first boundary of the first electrode layer is in a range from 30° to 60°; and a slope angle of the second boundary of the first electrode layer is in a range from 30° to 60°.

In some implementations, the display substrate further includes a buffer layer located between the first electrode layer and the first conductive layer in the first non-bending region; and
　a first boundary of the buffer layer is located in the adjacent area between the bending region and the first non-bending region, and an orthographic projection of the first boundary of the buffer layer on the first conductive layer overlaps that of the first boundary of the first electrode layer on the first conductive layer.

In some implementations, the display substrate further includes a buffer layer located between the first electrode layer and the first conductive layer in the first non-bending region; and
　a first boundary of the buffer layer is located in the adjacent area between the bending region and the first non-bending region, and an orthographic projection of the first boundary of the buffer layer on the first conductive layer is located between the orthographic projection of the first boundary of the second electrode layer on the first conductive layer and the orthographic projection of the first boundary of the first electrode layer on the first conductive layer.

In some implementations, the buffer layer is also located in the second non-bending region; and
　a second boundary of the buffer layer is located in the adjacent area between the bending region and the second non-bending region, and an orthographic projection of the second boundary of the buffer layer on the first conductive layer overlaps that of the second boundary of the first electrode layer on the first conductive layer.

In some implementations, the buffer layer is also located in the second non-bending region; and
　a second boundary of the buffer layer is located in the adjacent area between the bending region and the second non-bending region, and an orthographic projection of the second boundary of the buffer layer on the first conductive layer is located between the orthographic projection of the second boundary of the second electrode layer on the first conductive layer and the orthographic projection of the second boundary of the first electrode layer on the first conductive layer.

In some implementations, a thickness of the buffer layer is in a range from 800 Å to 1000 Å.

In some implementations, the insulating layer further includes a third boundary;
　the first conductive layer includes a first boundary located in the first non-bending region; and
　an orthographic projection of the third boundary of the insulating layer on the display substrate is located on a side of the first boundary of the first conductive layer away from the bending region.

In some implementations, the insulating layer further includes a fourth boundary;
　the first conductive layer further includes a second boundary located in the second non-bending region; and
　an orthographic projection of the fourth boundary of the insulating layer on the display substrate is located on a side of the second boundary of the first conductive layer away from the bending region.

In some implementations, the display substrate further includes a planarization layer and an inorganic insulating layer, which are sequentially disposed on a side of the first conductive layer away from the touch layer; and
　the planarization layer extends from the bending region into the first non-bending region and the second non-bending region; and the inorganic insulating layer is located in the first non-bending region and the second non-bending region.

In a second aspect, an embodiment of the present disclosure further provides a display device, including the display panel described above.

BRIEF DESCRIPTION OF DRAWINGS

The accompanying drawings are used to provide a further understanding of the present disclosure, and constitute a part of the specification. The drawings are used to explain the present disclosure in conjunction with the embodiments of the present disclosure, but do not constitute any limitation to the present disclosure. The above and other features and advantages will become more apparent to those of ordinary skill in the art through the description of specific exemplary embodiments with reference to the drawings. In the drawings.

DETAIL DESCRIPTION OF EMBODIMENTS

Figure 1:
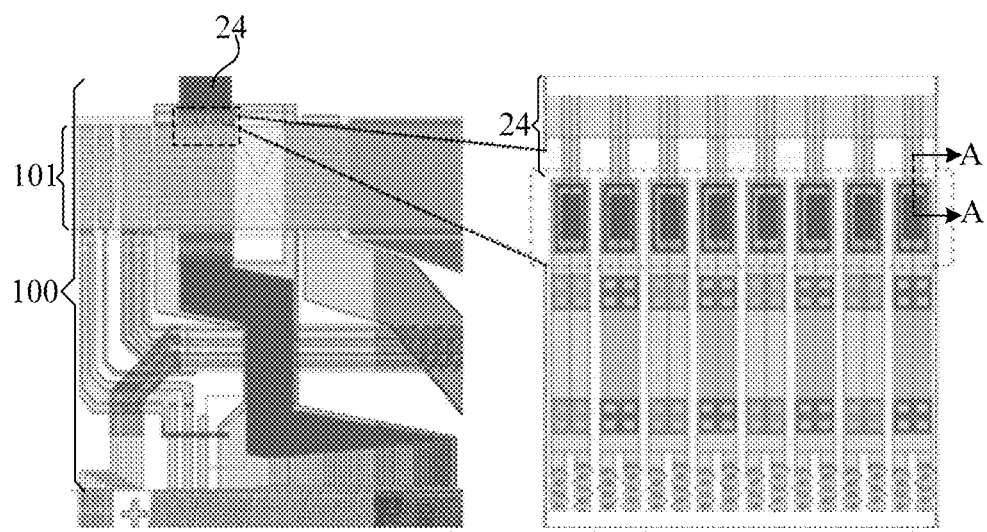
FIG. 1 is a top view of a partial structure of a bonding region of a display screen provided with an FMLOC touch layer in the related art.
Figure 2:
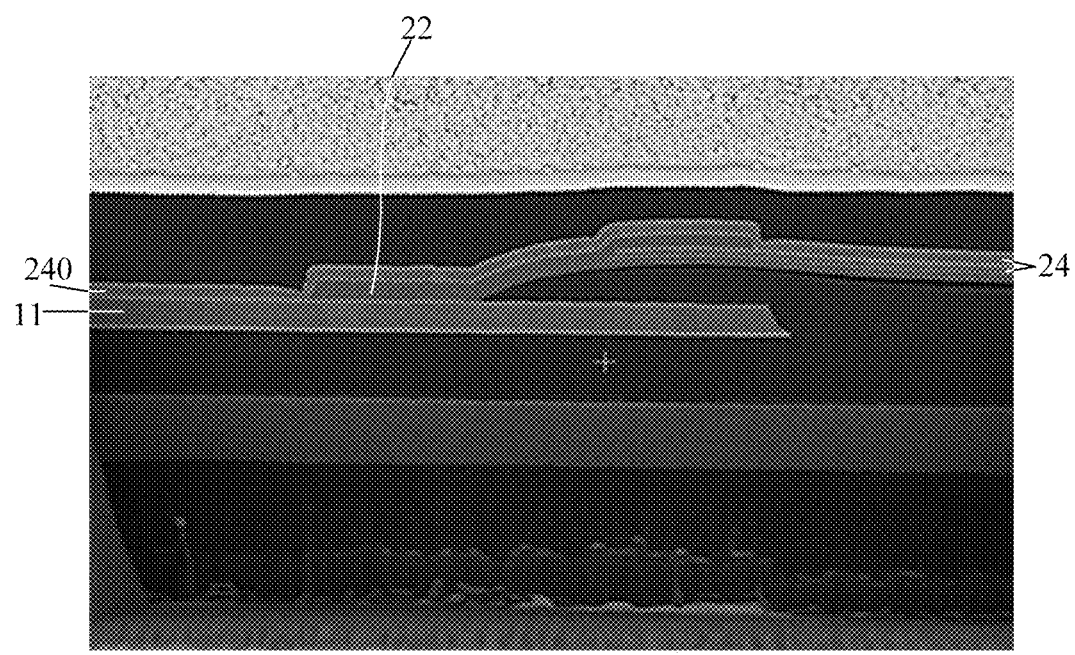
FIG. 2 is an electron micrograph illustrating overlapping of an upper metal wire of a touch signal wire and a signal line within a display screen taken along a line AA shown in FIG. 1.
Figure 3:
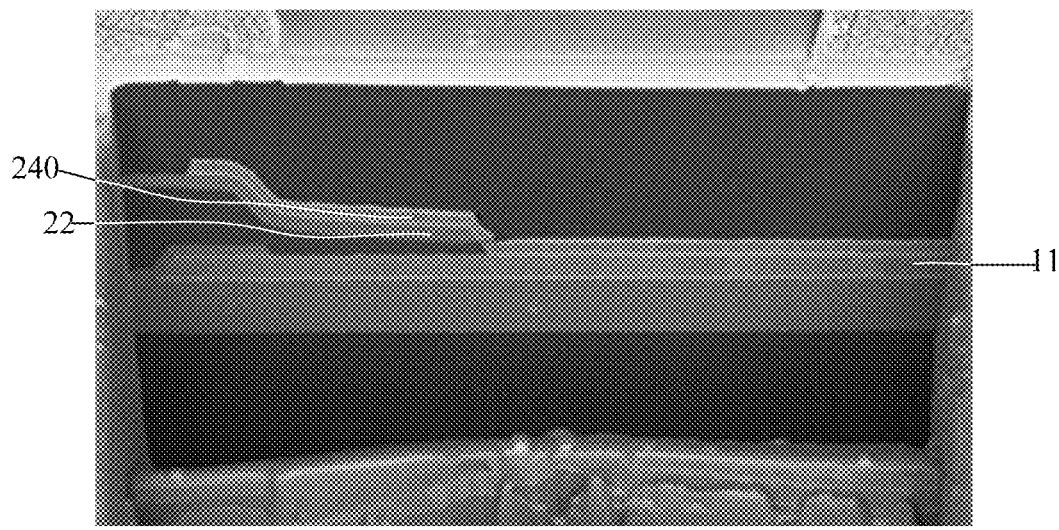
FIG. 3 is an electron micrograph illustrating fracture of an upper metal wire of a touch signal wire at a position where a relatively large step exists taken along the line AA shown in FIG. 1.
Figure 4:
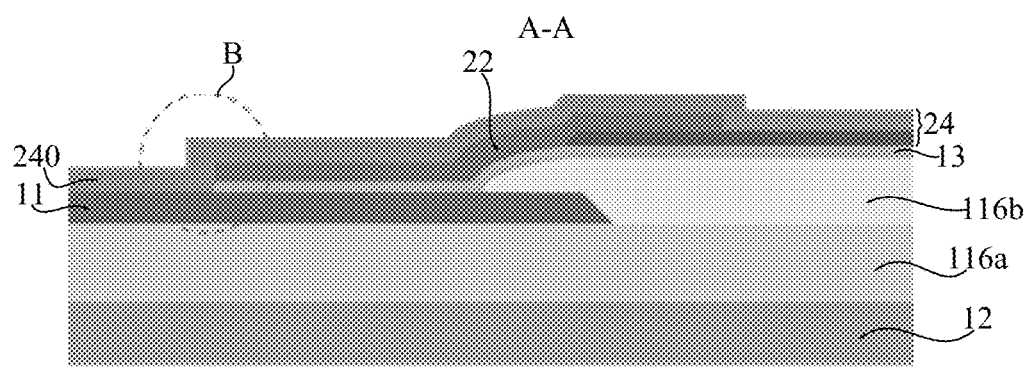
FIG. 4 is a structural cross-sectional view taken along the line AA shown in FIG. 1.
Figure 5:
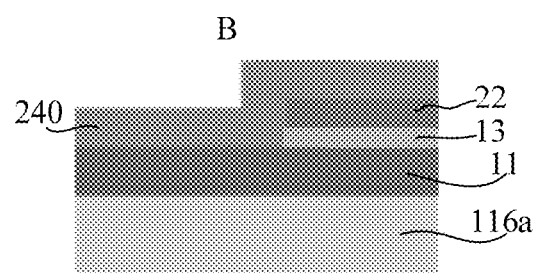
FIG. 5 is an enlarged view of a portion B shown in FIG. 4.

In order to enable those of ordinary skill in the art to better understand the technical solutions of the embodiments of the present disclosure, the display panel and the display device provided by the embodiments of the present disclosure are further described in detail below with reference to the drawings and specific implementations.

The embodiments of the present disclosure will be described more fully below with reference to the drawings, but the embodiments illustrated herein may be embodied in different forms and should not be interpreted as being limited to the embodiments described herein. Rather, the embodiments are provided to make the present disclosure thorough and complete, and are intended to enable those of ordinary skill in the art to fully understand the scope of the present disclosure.

The embodiments of the present disclosure are not limited to those illustrated by the drawings, but include modifications to configuration formed based on a manufacturing process. Thus, the regions shown in the drawings are illustrative, and the shapes of the regions shown in the drawings illustrate specific shapes of the regions, but are not intended to make limitations.

With reference to FIG. 1, a bonding region 100 is provided at an edge on a side of a display screen provided with an FMLOC touch layer, and various signal wires within the display screen and a touch signal wire 24 of the FMLOC touch layer are all led to the bonding region 100 so as to be bonded and connected to a peripheral circuit board; and the peripheral circuit board is configured to provide driving signals or control signals for the various signal wires within the display screen and the touch signal wire 24 of the FMLOC touch layer. In order to realize a narrow bezel of the display screen, an end region of the bonding region 100 away from a display region of the display screen needs to be bent to a back side of the display screen, and part of the bonding region 100 is correspondingly set as a flexible bending region 101, so that the end region of the bonding region 100 may be bent to the back side of the display screen by bending at the flexible bending region 101.

For the display screen provided with the FMLOC touch layer, in order to ensure good bending performance of the flexible bending region 101 and to ensure that configuration of the film layers in the part of the bonding region that is bent to the back side of the display screen is consistent with that of the film layers in the other part of the bonding region that is not bent to the back side of the display screen, a layer changing design is currently adopted when the touch signal wire 24 of the FMLOC touch layer is led to the flexible bending region 101 (i.e., a Bending region), that is, when entering the flexible bending region 101, the touch signal wire 24 of the FMLOC touch layer is subjected to layer changing to be changed onto a signal line within the display screen, and is then led to the flexible bending region 101 by means of the signal line within the display screen; after the signal line within the display screen passes through the flexible bending region 101, layer changing is performed, so that the signal line within the display screen is changed to be the touch signal wire 24 of the FMLOC touch layer, and the touch signal wire 24 of the FMLOC touch layer is then connected to a bonding connection end connected to a peripheral circuit.

With reference to FIG. 2 to FIG. 5, at a layer changing position where the layer changing between the touch signal wire 24 of the FMLOC touch layer and the signal line 11 within the display screen is performed, the touch signal wire 24 of the FMLOC touch layer is changed from a metal wire formed by two stacked conductive layers to an upper metal wire 240 alone extending out and connected to the signal line 11 within the display screen in an overlapping manner, with the signal line 11 within the display screen on a surface layer of the display screen, thus realizing the layer changing of the touch signal wire 24 of the FMLOC touch layer to the signal line 11 within the display screen. In an area where only the upper metal wire 240 of the touch signal wire 24 of the FMLOC touch layer extends out, a buffer layer 13 and an insulating layer 22 are sandwiched between the upper metal wire 240 and the signal line 11 within the display screen, and a boundary of the buffer layer 13 is flush with a boundary of the insulating layer 22 at the position where the upper metal wire 240 overlaps the signal line 11 within the display screen; the signal line 11 within the display screen is provided on a first planarization film layer 116a, and an inorganic insulating layer 12 is disposed on a side of the first planarization film layer 116a away from the signal line 11 within the display screen; and a second planarization film layer 116b is further disposed on a side of the first planarization film layer 116a close to the buffer layer 13. Each of the inorganic insulating layer 12, the first planarization film layer 116a and the second planarization film layer 116b extends from the display region of the display screen, and the second planarization film layer 116b is removed at the layer changing position where the layer changing between the touch signal wire 24 of the FMLOC touch layer and the signal line 11 within the display screen is performed (that is, a via is formed at the layer changing position). Due to a relatively large stacking thickness (about 3600 Å to about 4200 Å) of the insulating layer 22 and the buffer layer 13 and a relatively large slope angle (about 80° to about 90°) of the boundaries of the stacked insulating layer 22 and buffer layer 13, a step formed by the boundaries of the insulating layer 22 and the buffer layer 13 is relatively large at the layer changing position, which can easily cause fracture of the upper metal wire 240 at the layer changing position, and thus cause disconnection of the upper metal wire 240, resulting in poor touch.

In view of the above technical problem that the step formed by the boundaries of the inorganic insulating layer and the buffer layer at the layer changing position is relatively large, which can easily cause the disconnection of the upper metal wire and thus cause the poor touch, an embodiment of the present disclosure provides a display panel. With reference to FIG. 6 to FIG. 9 and FIG. 11, the display panel includes: a display substrate 1; and a touch layer 2 disposed on at least one side of the display substrate 1. The display substrate 1 includes a display region 104 and a bonding region 100 located on at least one side of the display region 104. The bonding region 100 includes a bending region 101 and a first non-bending region 102, which are adjacent to each other. The display substrate 1 further includes a first conductive layer 10 at least located in the bending region 101. The touch layer 2 is located in the first non-bending region 102. A first boundary 201 of the touch layer 2 is located in an adjacent area between the bending region 101 and the first non-bending region 102. The touch layer 2 includes a first electrode layer 21, an insulating layer 22 and a second electrode layer 23, which are sequentially disposed away from the first conductive layer 10. An edge of the second electrode layer 23 overlaps an edge of the first conductive layer 10, and orthographic projections of first boundaries of the second electrode layer 23, the first electrode layer 21 and the insulating layer 22 on the display substrate 1 do not overlap one another, and are sequentially located away from the bending region 101. As shown by the dashed box in FIG. 7, the first boundary 201 of the touch layer 2 includes different boundaries of the film layers included in the touch layer.

Figure 6:
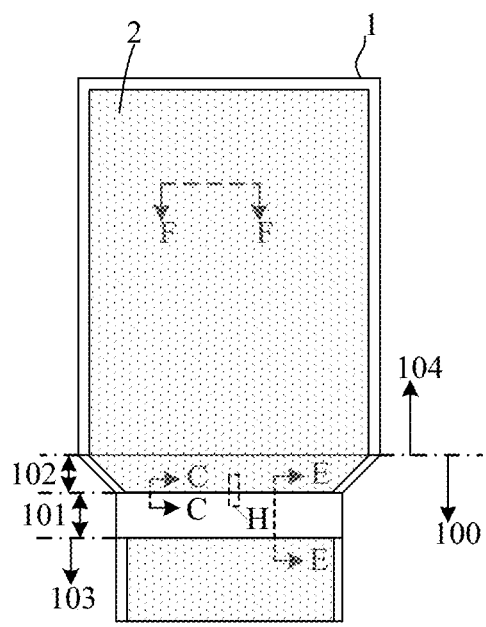
FIG. 6 is a structural top view of a display panel according to an embodiment of the present disclosure.
Figure 7:
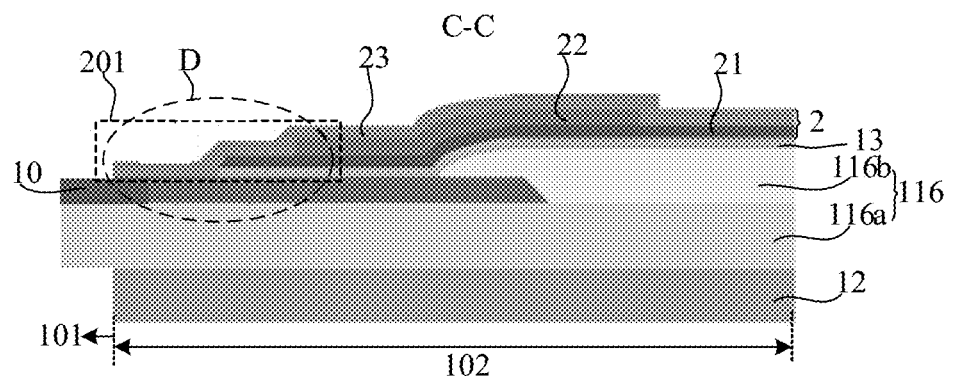
FIG. 7 is a structural cross-sectional view taken along a line CC shown in FIG. 6.
Figure 8:
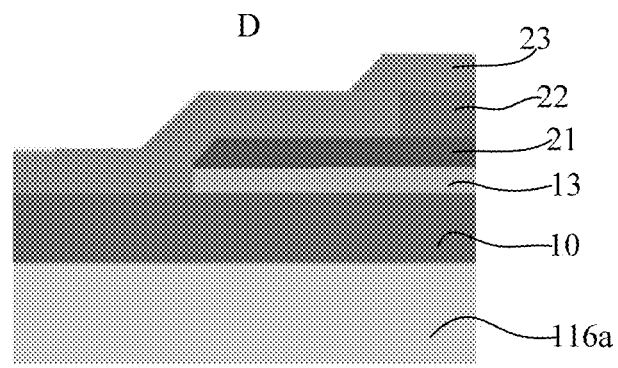
FIG. 8 is an enlarged view of a portion D shown in FIG. 7.
Figure 9:
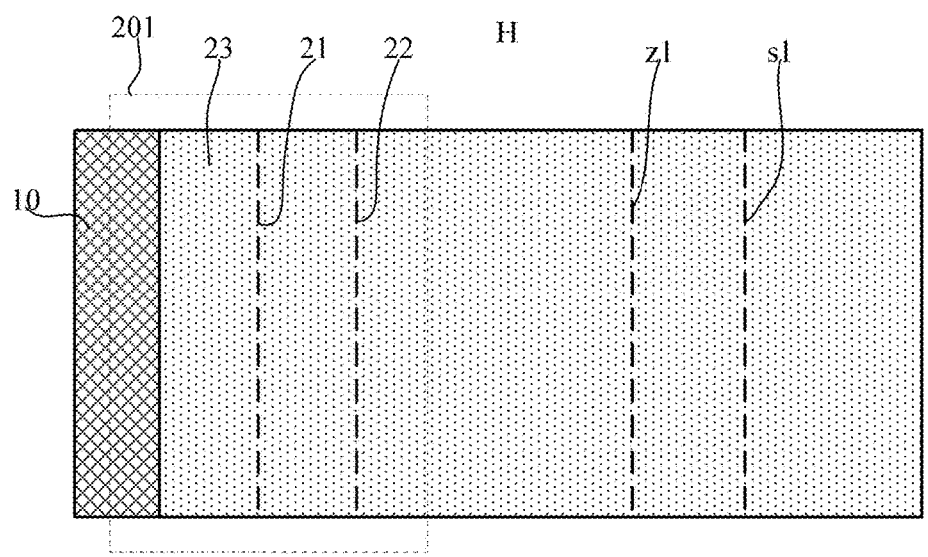
FIG. 9 is a structural top view of a portion H shown in FIG. 6.
Figure 10:
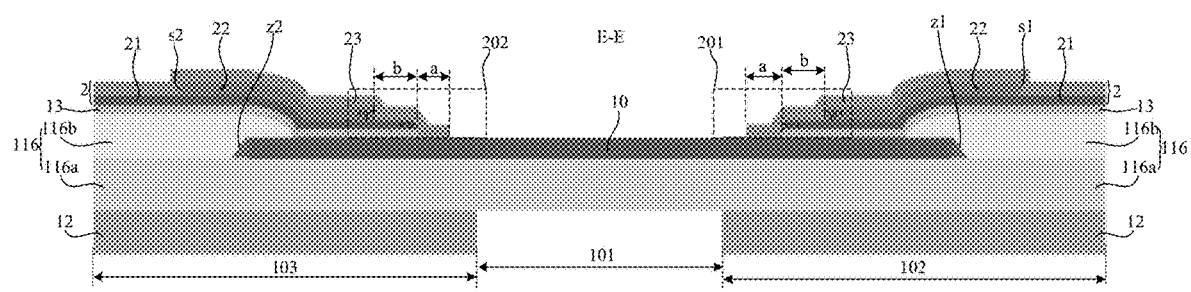
FIG. 10 is a structural cross-sectional view taken along a line EE shown in FIG. 6.

In some implementations, with reference to FIG. 6 and FIG. 10, the bonding region 100 further includes a second non-bending region 103 located on a side of the bending region 101 away from the first non-bending region 102, and the second non-bending region 103 is adjacent to the bending region 101. The touch layer 2 is also located in the second non-bending region 103. The second boundary 202 of the touch layer 2 is located in an adjacent area between the bending region 101 and the second non-bending region 103; and orthographic projections of second boundaries of the second electrode layer 23, the first electrode layer 21 and the insulating layer 22 on the display substrate 1 do not overlap one another, and are sequentially located away from the bending region 101. The second boundary 202 of the touch layer 2 includes different boundaries of the film layers included in the touch layer.

The first boundary 201 of the touch layer 2 includes the first boundaries of the second electrode layer 23, the first electrode layer 21 and the insulating layer 22. The second boundary 202 of the touch layer 2 includes the second boundaries of the second electrode layer 23, the first electrode layer 21 and the insulating layer 22. The second non-bending region 103 of the bonding region 100 is bent to a back side of the display substrate 1 through the bending region 101, and the back side of the display substrate 1 is opposite to a display side of the display substrate 1. An edge of the second electrode layer 23 overlaps an edge of the first conductive layer 10 in the adjacent area between the bending region 101 and the first non-bending region 102, so as to allow layer changing of the second electrode layer 23 of the touch layer 2 to the first conductive layer 10 of the display substrate 1 in the adjacent area between the bending region 101 and the first non-bending region 102, and meanwhile allow layer changing of the first conductive layer 10 of the display substrate 1 to the second electrode layer 23 of the touch layer 2 in the adjacent area between the bending region 101 and the second non-bending region 103.

In some implementations, the display substrate 1 further includes a planarization layer 116 and an inorganic insulating layer 12, which are sequentially disposed on a side of the first conductive layer 10 away from the touch layer 2; the planarization layer 116 extends from the bending region 101 to the first non-bending region 102 and the second non-bending region 103; and the inorganic insulating layer 12 is located in the first non-bending region 102 and the second non-bending region 103.

Both the planarization layer 116 and the inorganic insulating layer 12 extend out from the display region of the display substrate 1.

In some implementations, only the first conductive layer 10 and the organic insulating film layers for supporting and protecting the first conductive layer 10, such as the planarization layer 116 below the first conductive layer 10 and a protective layer above the first conductive layer 10, are kept in the bending region 101, so as to ensure good bending performance of the bending region 101 and prevent a signal line within the bending region 101 from being broken during a bending process. In addition to the first conductive layer 10 and the organic insulating film layer for supporting and protecting the first conductive layer 10, the inorganic insulating layer 12 extending from the display region of the display substrate 1 is also kept in the first non-bending region 102 and the second non-bending region 103, so as to ensure that the configuration of the film layers in the first non-bending region 102 is consistent with that in the second non-bending region 103.

In some implementations, the orthographic projections of the first boundaries and the second boundaries of the second electrode layer 23, the first electrode layer 21 and the insulating layer 22 on the display substrate 1 do not overlap one another and are located sequentially away from the bending region 101 in the adjacent area between the bending region 101 and the first non-bending region 102 and the adjacent area between the bending region 101 and the second non-bending region 103, so that a step formed by the film layers between the second electrode layer 23 of the touch layer 2 and the first conductive layer 10 of the display substrate 1 may be reduced when layer changing of signal lines is performed between the bending region 101 and the non-bending regions in the bonding region 100. Thus, fracture of the second electrode layer 23 of the touch layer 2 at a position where a relative large step exists may be avoided, thereby avoiding poor touch of the touch layer 2 and ensuring touch quality of the touch layer 2.

In some implementations, the first conductive layer 10 further extends into the first non-bending region 102; and the orthographic projections of the first boundaries of the second electrode layer 23, the first electrode layer 21 and the insulating layer 22 on the display substrate 1 fall on the first conductive layer 10.

In some implementations, the first conductive layer 10 further extends into the second non-bending region 103, and the orthographic projections of the second boundaries of the second electrode layer 23, the first electrode layer 21 and the insulating layer 22 on the display substrate 1 fall on the first conductive layer 10.

In some implementations, the orthographic projection of the first boundary of the second electrode layer 23 on the display substrate 1 overlaps a bordering boundary between the bending region 101 and the first non-bending region 102; and the orthographic projection of the second boundary of the second electrode layer 23 on the display substrate 1 overlaps a bordering boundary between the bending region 101 and the second non-bending region 103. That is, the touch layer 2 is not disposed in the bending region 101.

In some implementations, the orthographic projection of the first boundary of the first electrode layer 21 on the display substrate 1 is separated from the orthographic projection of the first boundary of the second electrode layer 23 on the display substrate 1 by a first distance a; the orthographic projection of the first boundary of the first electrode layer 21 on the display substrate 1 is separated from the orthographic projection of the first boundary of the insulating layer 22 on the display substrate 1 by a second distance b; the orthographic projection of the second boundary of the first electrode layer 21 on the display substrate 1 is separated from the orthographic projection of the second boundary of the second electrode layer 23 on the display substrate 1 by the first distance a; the orthographic projection of the second boundary of the first electrode layer 21 on the display substrate 1 is separated from the orthographic projection of the second boundary of the insulating layer 22 on the display substrate 1 by the second distance b; and the first distance a is smaller than or equal to the second distance b.

In some implementations, the first distance a is in a range from 4 µm to 8 µm; and the second distance b is in a range from 5 µm to 10 µm.

In some implementations, a thickness of the insulating layer 22 is in a range from 2800 Å to 3200 Å; and a thickness of the first electrode layer 21 is in a range from 1800 Å to 2200 Å. The thickness of the insulating layer 22 is a dimension of the insulating layer 22 in a direction away from the display substrate 1. The thickness of the first electrode layer 21 is a dimension of the first electrode layer 21 in the direction away from the display substrate 1. The thicknesses of the insulating layer 22 and the first electrode layer 21 are both much smaller than the stacking thickness of the inorganic insulating film layer and the buffer layer shown in FIG. 2 to FIG. 5, so that a step formed by the insulating layer 22 and a step formed by the first electrode layer 21 are also both much smaller than the step formed by the stacked inorganic insulating film layer and buffer layer shown in FIG. 2 to FIG. 5. Thus, the fracture of the second electrode layer 23 due to the relatively large step may be avoided, thereby avoiding the poor touch of the touch layer 2.

In some implementations, a slope angle $\theta 1$ of the first boundary of the insulating layer 22 is in a range from 80° to 90°; a slope angle $\theta 2$ of the second boundary of the insulating layer 22 is in a range from 80° to 90°; a slope angle $\alpha 1$ of the first boundary of the first electrode layer 21 is in a range from 30° to 60°; and a slope angle $\alpha 2$ of the second boundary of the first electrode layer 21 is in a range from 30° to 60°. Since the first boundary of the insulating layer 22 and the first boundary of the first electrode layer 21 are separated from each other, and the second boundary of the insulating layer 22 and the second boundary of the first electrode layer 21 are separated from each other, respective steps formed by the slope angles of the first boundaries and the slope angles of the second boundaries of the insulating layer 22 and the first electrode layer 21 are all smaller than the step formed by the slope angle of the boundaries of the stacked inorganic insulating film layer and buffer layer shown in FIG. 2 to FIG. 5, so that the fracture of the second electrode layer 23 due to the relatively large step may be avoided, thereby avoiding the poor touch of the touch layer 2.

In some implementations, the display substrate 1 further includes a buffer layer 13 located between the first electrode layer 21 and the first conductive layer 10 in the first non-bending region 102; and a first boundary of the buffer layer 13 is located in the adjacent area between the bending region 101 and the first non-bending region 102, and an orthographic projection of the first boundary of the buffer layer 13 on the first conductive layer 10 overlaps that of the first boundary of the first electrode layer 21 on the first conductive layer 10. The first electrode layer 21 is a metal conductive layer, and the planarization layer 116 is an organic insulating layer. The buffer layer 13 is provided, so that an adhesion of the first electrode layer 21 to the planarization layer 116 can be enhanced.

In some implementations, the buffer layer 13 is also located in the second non-bending region 103; and a second boundary of the buffer layer 13 is located in the adjacent area between the bending region 101 and the second non-bending region 103, and an orthographic projection of the second boundary of the buffer layer 13 on the first conductive layer 10 overlaps that of the second boundary of the first electrode layer 21 on the first conductive layer 10.

In some implementations, a thickness of the buffer layer 13 is in a range from 800 Å to 1000 Å. The thickness of the buffer layer 13 is a dimension of the buffer layer 13 in the direction away from the display substrate 1. The thickness of the buffer layer 13 is relatively small, so that the first boundary and the second boundary of the buffer layer 13, which overlap the first electrode layer 21, may not form relatively large steps at the layer changing positions. Thus, the fracture of the second electrode layer 23 due to the relatively large step may be avoided, there avoiding the poor touch of the touch layer 2.

Figure 11:
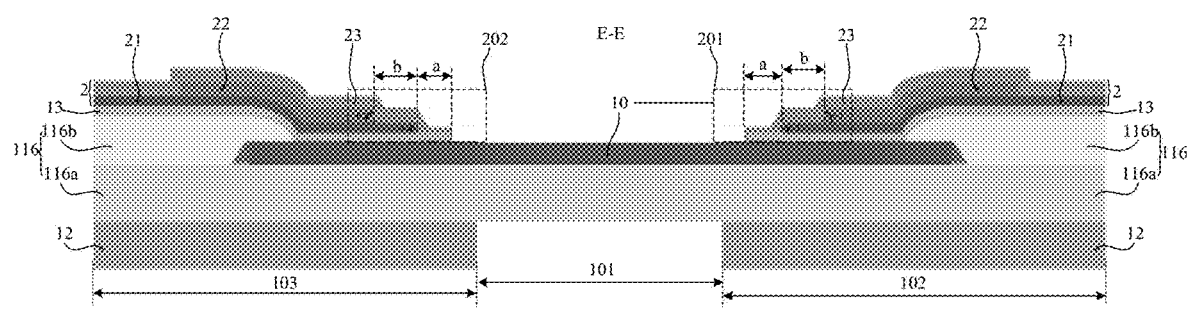
FIG. 11 is another structural cross-sectional view taken along the line EE shown in FIG. 6.

In some implementations, with reference to FIG. 11, the orthographic projection of the first boundary of the buffer layer 13 on the first conductive layer 10 may be located between the orthographic projection of the first boundary of the second electrode layer 23 on the first conductive layer 10 and the orthographic projection of the first boundary of the first electrode layer 21 on the first conductive layer 10. That is, the first boundary of the buffer layer 13 is separated from the first boundary of the second electrode layer 23, and the first boundary of the first electrode layer 21. Such configuration may further prevent the first boundary of the buffer layer 13 from forming a relatively large step at the layer changing position, so that the fracture of the second electrode layer 23 due to the relatively large step may be avoided, thereby avoiding the poor touch of the touch layer 2.

In some implementations, the orthographic projection of the second boundary of the buffer layer 13 on the first conductive layer 10 is located between the orthographic projection of the second boundary of the second electrode layer 23 on the first conductive layer 10 and the orthographic projection of the second boundary of the first electrode layer 21 on the first conductive layer 10. That is, the second boundary of the buffer layer 13 is separated from the second boundary of the second electrode layer 23 and the second boundary of the first electrode layer 21. Such configuration may further prevent the second boundary of the buffer layer 13 from forming a relatively large step at the layer changing position, so that the fracture of the second electrode layer 23 due to the relatively large step may be avoided, thereby avoiding the poor touch of the touch layer 2.

In some implementations, the insulating layer 22 further includes a third boundary s1; the first conductive layer 10 includes a first boundary z1 located in the first non-bending region 102; and an orthographic projection of the third boundary s1 of the insulating layer 22 on the display substrate 1 is located on a side of the first boundary z1 of the first conductive layer 10 away from the bending region 101.

In some implementations, the insulating layer 22 further includes a fourth boundary s2; the first conductive layer 10 further includes a second boundary z2 located in the second non-bending region 103; and an orthographic projection of the fourth boundary s2 of the insulating layer 22 on the display substrate 1 is located on a side of the second boundary z2 of the first conductive layer 10 away from the bending region 101.

In some implementations, the first electrode layer 21 and the second electrode layer 23 are stacked in other regions of the bonding region 100 except for the bending region 101, the first non-bending region 102 and the second non-bending region 103, without sandwiching the insulating layer 22 therebetween, so that a cross-sectional area of a touch electrode layer may be increased, and wire resistance of the touch electrode layer may be reduced.

Figure 12:
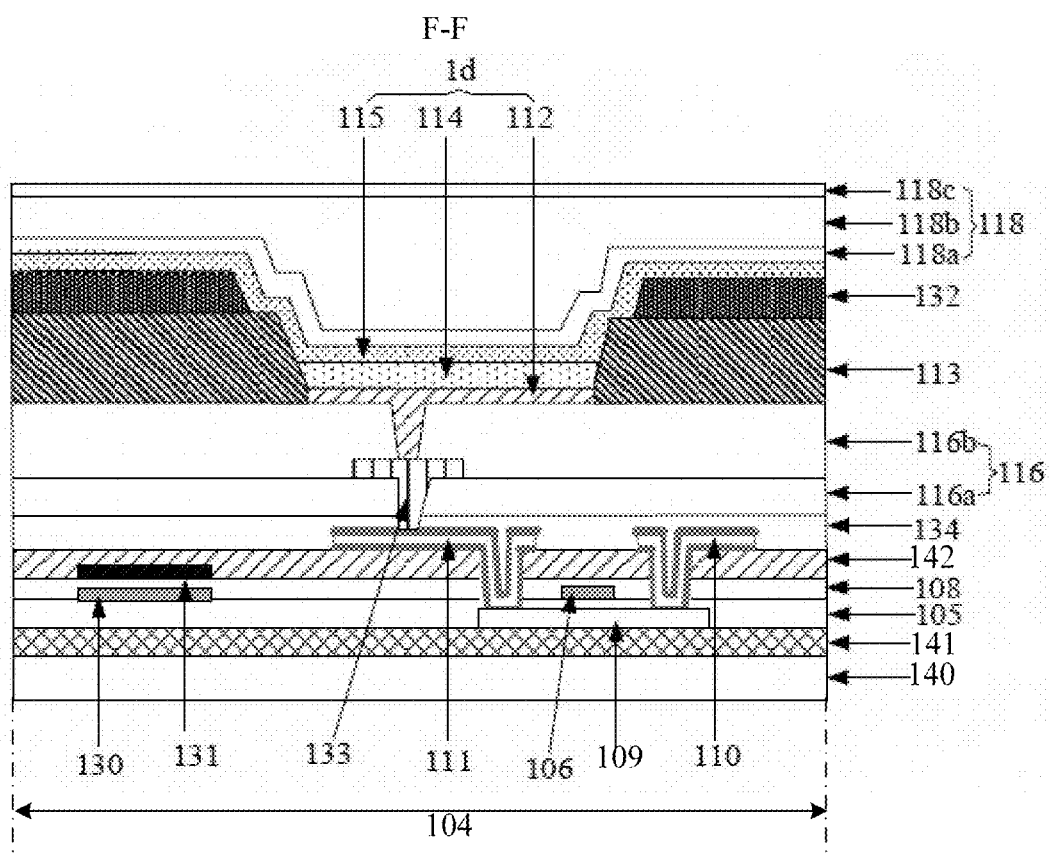
FIG. 12 is a structural cross-sectional view taken along a line FF shown in FIG. 6.

In some implementations, with reference to FIG. 12, the display substrate 1 further includes the display region 104. In the display region 104, the display substrate 1 includes a base, a driving circuit layer disposed on the base, a display device disposed on the driving circuit layer, and a packaging layer for packaging the display device. The base may be a single-layer glass base, or may include a plurality of polyimide layers 140 and inorganic material layers 141 which are stacked in sequence; the inorganic material layers 141 may be made of silicon nitride, silicon oxide and the like to produce an effect of resisting water and oxygen and blocking alkaline ions; and it should be noted that the structure of the base is not limited thereto, and may be set according to actual needs. The driving circuit layer may include a thin film transistor and a capacitor structure. The thin film transistor may be of a top-gate type, and may include an active layer 109, a first gate insulating layer 105, a gate electrode 106, a second gate insulating layer 108, an interlayer dielectric layer 142, a source electrode 110, and a drain electrode 111. Specifically, the active layer 109 may be formed on the base, the first gate insulating layer 105 covers the active layer 109, the gate electrode 106 is formed on a side of the first gate insulating layer 105 away from the active layer 109, the second gate insulating layer 108 covers the gate electrode 106 and the first gate insulating layer 105, the interlayer dielectric layer 142 covers the second gate insulating layer 108, the source electrode 110 and the drain electrode 111 are formed on a side of the interlayer dielectric layer 142 away from the base and respectively located on two opposite sides of the gate electrode 106, and the source electrode 110 and the drain electrode 111 may be in contact with two opposite sides of the active layer 109 through via holes (e.g., metal via holes), respectively. It should be understood that the thin film transistor may also be of a bottom-gate type.

In some implementations, the capacitor structure may include a first electrode plate 130 and a second electrode plate 131, the first electrode plate 130 is disposed in the same layer as the gate electrode 106, and the second electrode plate 131 is disposed between the second gate insulating layer 108 and the interlayer dielectric layer 142 and opposite to the first electrode plate 130.

In some implementations, a material of the gate electrode 106, the first electrode plate 130 and the second electrode plate 131 may include a metal material or an alloy material, such as molybdenum, aluminum, or titanium. A material of the source electrode 110 and the drain electrode 111 may include a metal material or an alloy material, such as a single-layer or multi-layer metal structure formed from molybdenum, aluminum, titanium, and the like. For example, the multi-layer structure is a lamination of multiple metal layers, such as a triple-layer lamination of titanium/aluminum/titanium/(Al/Ti/Al).

In some implementations, the display device may include a first electrode 112 and a pixel defining portion 113, which are sequentially formed on the interlayer dielectric layer 142. It should be understood that the display device may further include a light-emitting portion 114 and a second electrode 115. The planarization layer 116 is formed between the interlayer dielectric layer 142 and the first electrode 112. The first electrode 112 may be electrically connected to the drain electrode 111 through a metal via, and may be an anode made of indium tin oxide (ITO), indium zinc oxide (IZO), zinc oxide (ZnO), or the like; the pixel defining portion 113 may cover the planarization layer 116 and may be made of an organic material such as a photoresist, and is provided with a pixel opening which exposes the first electrode 112; the light-emitting portion 114 is located in the pixel opening and formed on the first electrode 112, and may include a small molecular organic material or a polymer molecular organic material, which may be a fluorescent material or a phosphorescent material, and may emit red light, green light, blue light or white light. Moreover, according to different actual needs, in different examples, the light-emitting portion 114 may further include functional layers such as an electron injection layer, an electron transport layer, a hole injection layer, and a hole transport layer; the second electrode 115 covers the light-emitting portion 114, and has a polarity opposite to that of the first electrode 112; and the second electrode 115 may be a cathode made of a metal material such as lithium (Li), aluminum (Al), magnesium (Mg), and silver (Ag).

It should be noted that the first electrode 112, the light-emitting portion 114, and the second electrode 115 may constitute one light-emitting sub-pixel 1d. A portion of the display device located in the display region 104 may include a plurality of light-emitting sub-pixels 1d arranged in an array. It should be further noted that the first electrodes 112 of all the light-emitting sub-pixels 1d are independent of one another, and the second electrodes 115 of all the light-emitting sub-pixels 1d are connected into an one-piece.

In some implementations, a support portion 132 may be further disposed on a side of the pixel defining portion 113 away from the interlayer dielectric layer 142, and may play a role of supporting a protective film layer (not shown) to prevent the protective film layer from being in contact with the first electrode 112 or other wires, thereby preventing the first electrode 112 or the other wires from being easily damaged. It should be noted that the protective film layer is mainly used during a process of transferring a semi-finished product to prevent the semi-finished product from being damaged in the transferring process. Specifically, the protective film layer may be formed to cover the substrate on which the support portion 132 is formed in a process of transferring the substrate to a deposition line, and may be removed when deposition of a luminescent material is to be performed.

In some implementations, a material of the support portion 132 may be the same as that of the pixel defining portion 113, and the support portion 132 and the pixel defining portion 113 may be formed by one patterning process. However, the present disclosure is not limited thereto, so the material of the support portion 132 may be different from that of the pixel defining portion 113, and the support portion 132 and the pixel defining portion 113 may be formed by different patterning processes.

In some implementations, as shown in FIG. 12, the first electrode 112 may be electrically connected to the drain electrode 111 through a transfer electrode 133. The planarization layer 116 has a double-layer structure, and may specifically include a first planarization film (PLN1) layer 116a and a second planarization film (PLN2) layer 116b, which are formed in sequence, and a passivation film (PVX) layer 134 may be further formed between the first planarization film layer 116a and the interlayer dielectric layer 142, and may be made of silicon oxide, silicon nitride, silicon oxynitride or the like; the passivation film layer 134 covers the source electrode 110 and the drain electrode 111; the transfer electrode 133 is formed between the first planarization film layer 116a and the second planarization film layer 116b, and is electrically connected to the drain electrode 111 sequentially through vias penetrating through the first planarization film layer 116a and the passivation film layer 134; and the first electrode 112 may be electrically connected to the transfer electrode 133 through a via (e.g. a metal via) in the second planarization film layer 116b.

In some implementations, a packaging layer 118 is configured to package the display device in the display region 104, that is, the packaging layer is not disposed in the bonding region 100. The packaging layer 118 includes a first inorganic packaging film layer 118a, an organic packaging film layer 118b, and a second inorganic packaging film layer 118c, which are stacked in sequence. The first inorganic packaging film layer 118a and the second inorganic packaging film layer 118c are configured to prevent water and oxygen from entering the light-emitting portion 114 in the display region 104; and the first inorganic packaging film layer 118a and the second inorganic packaging film layer 118c may be made of an inorganic material such as silicon nitride or silicon oxide. The organic packaging film layer 118b is configured to implement planarization to facilitate manufacturing of the second inorganic packaging film layer 118c, and may be made of an acrylic-based polymer, a silicon-based polymer or the like.

The first inorganic packaging film layer 118a and the second inorganic packaging film layer 118c may be formed by a chemical vapor deposition process, but the present disclosure is not limited thereto, and a physical vapor deposition process or the like may also be adopted; and the organic packaging film layer 118b is formed by an inkjet printing process, but the present disclosure is not limited thereto, and a spraying process or the like may also be adopted.

In some implementations, the first conductive layer 10 in the bending region 101 and the transfer electrode 133 are made of a same material and are disposed in a same layer, the pixel defining portion, the support portion and the second planarization film layer are removed in the bending region 101, and the first planarization film layer 116a is remained in the bending region 101. In the first non-bending region 102 and the second non-bending region 103, not only the first conductive layer 10 and the organic insulating film layer for supporting and protecting the first conductive layer 10, such as the planarization layer 116, is remained, but also the inorganic insulating layer 12, the interlayer dielectric layer 142, the passivation film layer 134, the first gate insulating layer 105, and the second gate insulating layer 108 extending from the display region of the display substrate 1 are remained.

Figure 13:
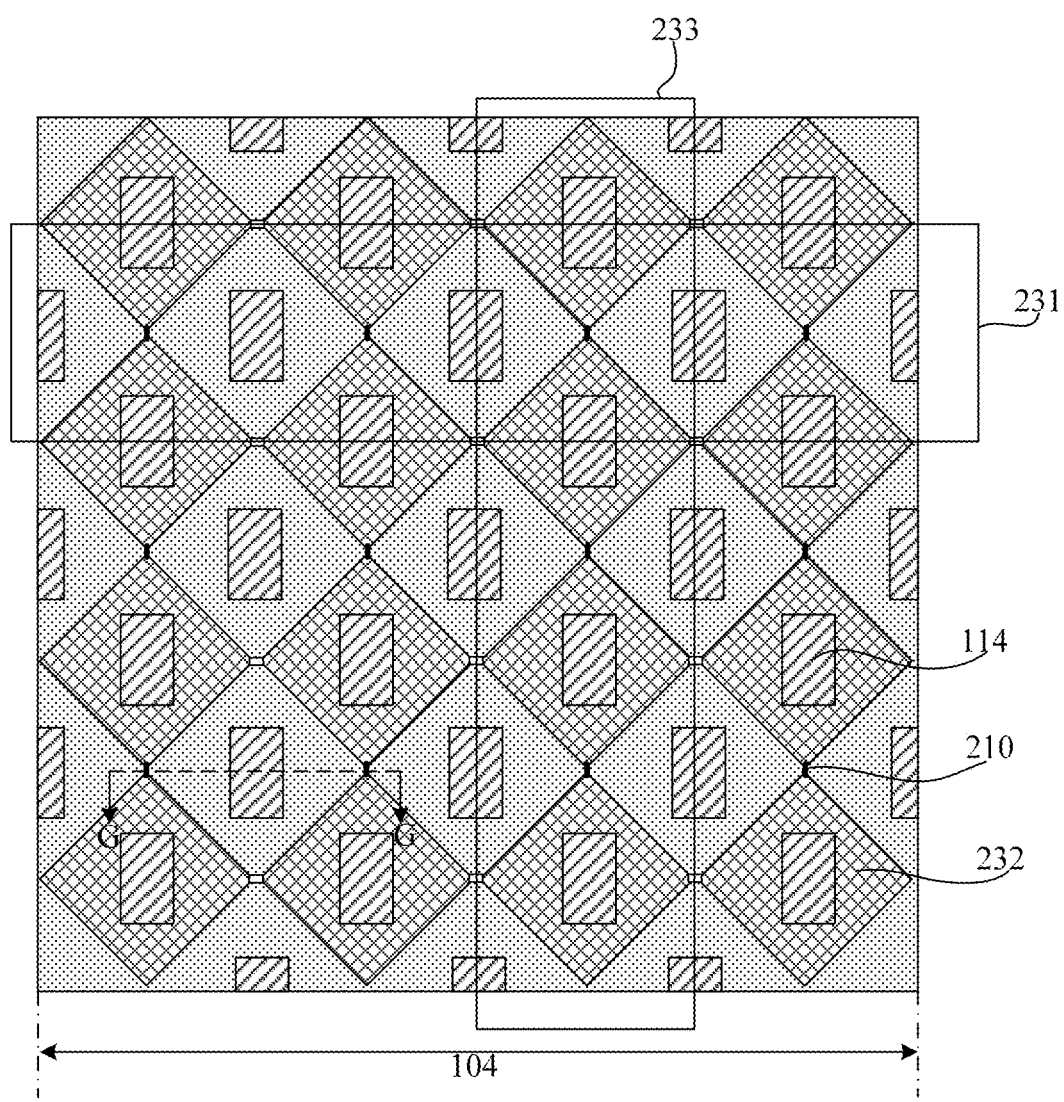
FIG. 13 is a top view of a local structure of a display region of a display panel according to an embodiment of the present disclosure.
Figure 14:
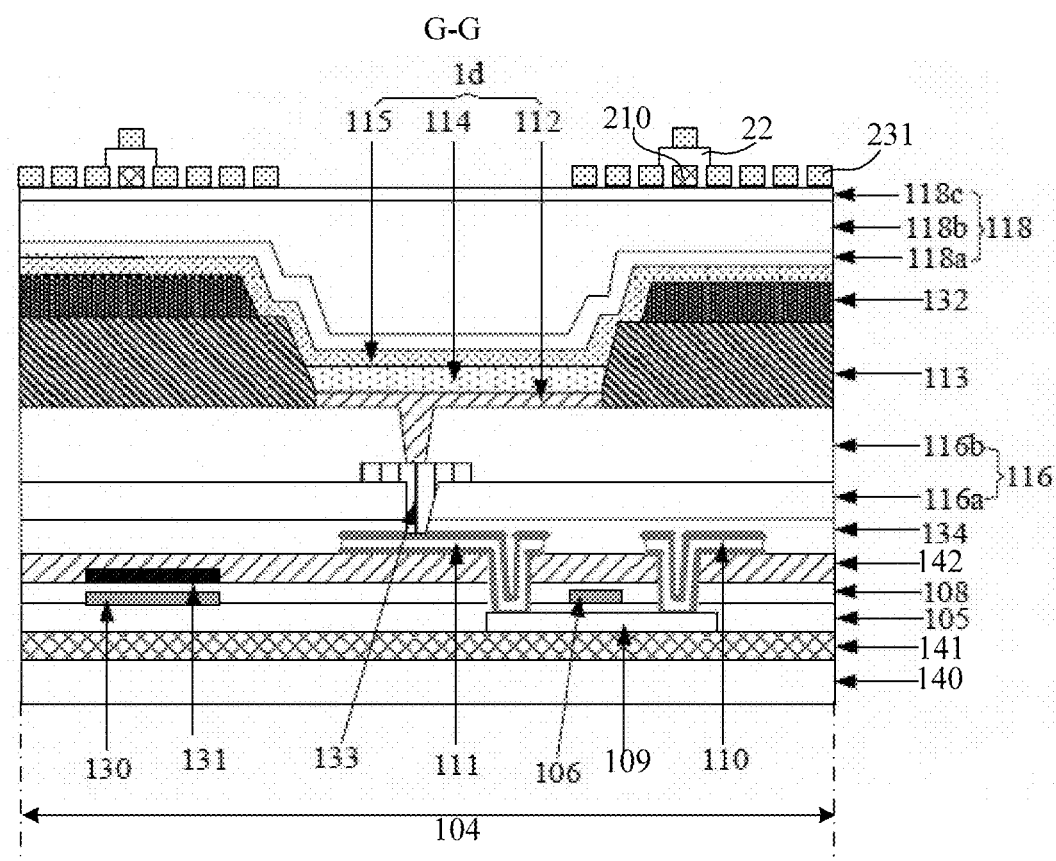
FIG. 14 is a structural cross-sectional view taken along a line GG shown in FIG. 13.

In some implementations, with reference to FIG. 13 and FIG. 14, in the display region 104, the touch layer 2 is disposed on a side of the packaging layer 118 away from the display device, the second electrode layer 23 of the touch layer 2 includes a plurality of driving electrode strips 231 and a plurality of sensing electrodes 232, the first electrode layer 21 includes a plurality of bridge parts 210, and the plurality of sensing electrodes 232 are arranged in an array, and any two adjacent sensing electrodes 232 arranged along a column direction of the array are connected by the bridge parts 210, thus forming sensing electrode strips 233; a length direction of each driving electrode strip 231 is along a row direction of the array, and the plurality of driving electrode strips 231 are sequentially arranged along the column direction of the array; and the driving electrode strips 231 and the sensing electrode strips 233 spatially intersect at the bridge parts 210, and the insulating layer 22 is disposed between each bridge part 210 and the driving electrode strips 231.

In some implementations, in the display region 104, an orthographic projection of the touch layer 2 on the display substrate 1 is located in an area where the pixel defining portion 113 between the light-emitting portions 114 is located. The second electrode layer 23 and the first electrode layer 21 are both mesh electrodes. In some implementations, each of the second electrode layer 23 and the first electrode layer 21 has a metal laminated structure, for example, each of the second electrode layer 23 and the first electrode layer 21 has a laminated structure of titanium/aluminum/titanium. Since the orthographic projection of the touch layer 2 on the display substrate 1 is located in the area where the pixel defining portion 113 is located, the arrangement of the touch layer 2 does not affect light transmittance of the display substrate 1.

In some implementations, patterns of the first electrode layer 21, the insulating layer 22, and the second electrode layer 23 in the touch layer 2 may be sequentially manufactured on the packaging layer 118 by a patterning process (including steps of film formation, exposure, development, and etching), which may not only reduce an total thickness of the display panel to facilitate folding of a flexible display panel, but may also avoid a fitting tolerance of a touch panel generated when the touch panel is externally attached to the display panel, thereby facilitating reducing the bezel width of the display panel.

When the touch layer in the display panel is manufactured based on the above structure of the display panel, mask patterns of the first electrode layer, the insulating layer and the second electrode layer are respectively adjusted and manufactured to allow the orthographic projections of the first boundaries and the second boundaries of the second electrode layer, the first electrode layer and the insulating layer on the display substrate not to overlap one another and to be sequentially located away from the bending region.

In the display panel provided by the embodiments of the present disclosure, with the orthographic projections of the first boundaries and the second boundaries of the second electrode layer, the first electrode layer and the insulating layer on the display substrate not overlapping one another and located sequentially away from the bending region in the adjacent area between the bending region and the first non-bending region and the adjacent area between the bending region and the second non-bending region, the step formed by the film layers between the second electrode layer of the touch layer and the first conductive layer of the display substrate can be reduced when the layer changing of the signal lines is performed between the bending region and the non-bending regions in the bonding region. Thus, the fracture of the second electrode layer of the touch layer at the position where the relative large step exists can be avoided, thereby avoiding the poor touch of the touch layer and ensuring the touch quality of the touch layer.

An embodiment of the present disclosure further provides a display device, including the display panel described in the above embodiments.

By adopting the display panel described in the above embodiments, touch quality of the display device may be ensured while display quality of the display device is ensured.

The display device may be any product or component with a display function, such as an Organic Light-Emitting Diode (OLED) panel, an OLED TV, a mobile phone, a tablet computer, a monitor, a notebook computer, a digital photo frame, and a navigator.

It should be understood that the above embodiments are merely exemplary embodiments adopted to illustrate the principle of the present disclosure, and the present disclosure is not limited thereto. Various modifications and improvements can be made by those of ordinary sill in the art without departing from the spirit and essence of the present disclosure, and these modifications and improvements are considered to fall within the scope of the present disclosure.

What is claimed is:

1. A display panel, comprising:
 a display substrate; and
 a touch layer disposed on at least one side of the display substrate, wherein
 the display substrate comprises a display region and a bonding region located on at least one side of the display region, and the bonding region comprises a bending region and a first non-bending region, which are adjacent to each other;
 the display substrate further comprises a first conductive layer at least located in the bending region;

the touch layer is located in the first non-bending region; and a first boundary of the touch layer is located in an adjacent area between the bending region and the first non-bending region;

the touch layer comprises a first electrode layer, an insulating layer and a second electrode layer, which are sequentially disposed away from the first conductive layer; and an edge of the second electrode layer overlaps an edge of the first conductive layer, and wherein orthographic projections of first boundaries of the second electrode layer, the first electrode layer and the insulating layer on the display substrate do not overlap one another, and are sequentially located away from the bending region, the bonding region further comprises a second non-bending region located on a side of the bending region away from the first non-bending region, and the second non-bending region is adjacent to the bending region;

the touch layer is also located in the second non-bending region; and a second boundary of the touch layer is located in an adjacent area between the bending region and the second non-bending region; and orthographic projections of second boundaries of the second electrode layer, the first electrode layer and the insulating layer on the display substrate do not overlap one another, and are sequentially located away from the bending region.

2. The display panel of claim 1, wherein the first conductive layer further extends into the first non-bending region; and the orthographic projections of the first boundaries of the second electrode layer, the first electrode layer and the insulating layer on the display substrate fall on the first conductive layer.

3. The display panel of claim 2, wherein the first conductive layer further extends into the second non-bending region; and the orthographic projections of the second boundaries of the second electrode layer, the first electrode layer and the insulating layer on the display substrate fall on the first conductive layer.

4. The display panel of claim 3, wherein the orthographic projection of the first boundary of the second electrode layer on the display substrate overlaps a bordering boundary between the bending region and the first non-bending region; and the orthographic projection of the second boundary of the second electrode layer on the display substrate overlaps a bordering boundary between the bending region and the second non-bending region.

5. The display panel of claim 4, wherein the orthographic projection of the first boundary of the first electrode layer on the display substrate is separated from the orthographic projection of the first boundary of the second electrode layer on the display substrate by a first distance;

the orthographic projection of the first boundary of the first electrode layer on the display substrate is separated from the orthographic projection of the first boundary of the insulating layer on the display substrate by a second distance;

the orthographic projection of the second boundary of the first electrode layer on the display substrate is separated from the orthographic projection of the second boundary of the second electrode layer on the display substrate by the first distance;

the orthographic projection of the second boundary of the first electrode layer on the display substrate is separated from the orthographic projection of the second boundary of the insulating layer on the display substrate by the second distance; and the first distance is smaller than or equal to the second distance.

6. The display panel of claim 5, wherein the first distance is in a range from 4 µm to 8 µm; and the second distance is in a range from 5 µm to 10 µm.

7. The display panel of claim 6, wherein a thickness of the insulating layer is in a range from 2800 Å to 3200 Å; and a thickness of the first electrode layer is in a range from 1800 Å to 2200 Å.

8. The display panel of claim 7, wherein a slope angle of the first boundary of the insulating layer is in a range from 80° to 90°; and a slope angle of the second boundary of the insulating layer is in a range from 80° to 90°; and a slope angle of the first boundary of the first electrode layer is in a range from 30° to 60°; and a slope angle of the second boundary of the first electrode layer is in a range from 30° to 60°.

9. The display panel of claim 3, wherein the display substrate further comprises a buffer layer located between the first electrode layer and the first conductive layer in the first non-bending region; and a first boundary of the buffer layer is located in the adjacent area between the bending region and the first non-bending region, and an orthographic projection of the first boundary of the buffer layer on the first conductive layer overlaps that of the first boundary of the first electrode layer on the first conductive layer.

10. The display panel of claim 3, wherein the display substrate further comprises a buffer layer located between the first electrode layer and the first conductive layer in the first non-bending region; and a first boundary of the buffer layer is located in the adjacent area between the bending region and the first non-bending region, and an orthographic projection of the first boundary of the buffer layer on the first conductive layer is located between the orthographic projection of the first boundary of the second electrode layer on the first conductive layer and the orthographic projection of the first boundary of the first electrode layer on the first conductive layer.

11. The display panel of claim 9, wherein the buffer layer is also located in the second non-bending region; and a second boundary of the buffer layer is located in the adjacent area between the bending region and the second non-bending region, and an orthographic projection of the second boundary of the buffer layer on the first conductive layer overlaps that of the second boundary of the first electrode layer on the first conductive layer.

12. The display panel of claim 9, wherein the buffer layer is also located in the second non-bending region; and a second boundary of the buffer layer is located in the adjacent area between the bending region and the second non-bending region, and an orthographic projection of the second boundary of the buffer layer on the first conductive layer is located between the orthographic projection of the second boundary of the second electrode layer on the first conductive layer and the orthographic projection of the second boundary of the first electrode layer on the first conductive layer.

13. The display panel of claim 9, wherein a thickness of the buffer layer is in a range from 800 Å to 1000 Å.

14. The display panel of claim 1, wherein the insulating layer further comprises a third boundary;
   the first conductive layer comprises a first boundary located in the first non-bending region; and
   an orthographic projection of the third boundary of the insulating layer on the display substrate is located on a side of the first boundary of the first conductive layer away from the bending region.

15. The display panel of claim 14, wherein the insulating layer further comprises a fourth boundary;
   the first conductive layer further comprises a second boundary located in the second non-bending region; and
   an orthographic projection of the fourth boundary of the insulating layer on the display substrate is located on a side of the second boundary of the first conductive layer away from the bending region.

16. The display panel of claim 15, the display substrate further comprises a planarization layer and an inorganic insulating layer, which are sequentially disposed on a side of the first conductive layer away from the touch layer; and
   the planarization layer extends from the bending region into the first non-bending region and the second non-bending region; and the inorganic insulating layer is located in the first non-bending region and the second non-bending region.

17. A display device, comprising the display panel of claim 1.

18. The display panel of claim 10, wherein the buffer layer is also located in the second non-bending region; and
   a second boundary of the buffer layer is located in the adjacent area between the bending region and the second non-bending region, and an orthographic projection of the second boundary of the buffer layer on the first conductive layer overlaps that of the second boundary of the first electrode layer on the first conductive layer.

19. The display panel of claim 10, wherein the buffer layer is also located in the second non-bending region; and
   a second boundary of the buffer layer is located in the adjacent area between the bending region and the second non-bending region, and an orthographic projection of the second boundary of the buffer layer on the first conductive layer is located between the orthographic projection of the second boundary of the second electrode layer on the first conductive layer and the orthographic projection of the second boundary of the first electrode layer on the first conductive layer.

* * * * *